(12) United States Patent
Ker et al.

(10) Patent No.: US 9,425,183 B2
(45) Date of Patent: Aug. 23, 2016

(54) ACTIVE GUARD RING STRUCTURE TO IMPROVE LATCH-UP IMMUNITY

(71) Applicant: NATIONAL CHIAO TUNG UNIVERSITY, Hsinchu (TW)

(72) Inventors: Ming-Dou Ker, Hsinchu County (TW); Hui-Wen Tsai, Kaohsiung (TW)

(73) Assignee: National Chiao Tung University, Hsinchu (TW)

( * ) Notice: Subject to any disclaimer, the term of this patent is extended or adjusted under 35 U.S.C. 154(b) by 134 days.

(21) Appl. No.: 14/468,497

(22) Filed: Aug. 26, 2014

(65) Prior Publication Data

US 2015/0318692 A1 Nov. 5, 2015

(30) Foreign Application Priority Data

May 2, 2014 (TW) .............. 103115815 A

(51) Int. Cl.
*H02H 9/02* (2006.01)
*H01L 27/02* (2006.01)

(52) U.S. Cl.
CPC ........... *H01L 27/0248* (2013.01); *H02H 9/025* (2013.01)

(58) Field of Classification Search
CPC ..................................................... H02H 9/025
USPC ........................................................... 361/87
See application file for complete search history.

(56) References Cited

U.S. PATENT DOCUMENTS

| | | | |
|---|---|---|---|
| 5,710,689 A * | 1/1998 | Becerra | H03K 17/0822 347/59 |
| 7,968,976 B2 | 6/2011 | Chang et al. | |
| 7,989,282 B2 | 8/2011 | Voldman | |
| 8,018,022 B2 | 9/2011 | Veliadis et al. | |
| 8,097,925 B2 | 1/2012 | Jensen et al. | |
| 8,106,514 B2 | 1/2012 | Nakashiba | |
| 8,164,139 B2 | 4/2012 | Hsieh | |
| 8,278,710 B2 | 10/2012 | Khemka et al. | |

(Continued)

FOREIGN PATENT DOCUMENTS

TW 201227909 A 7/2012

OTHER PUBLICATIONS

Farzan Farbiz; Elyse Rosenbaum; Modeling and Understanding of External Latchup in CMOS Technologies—Part I: Modeling Latchup Trigger Current; IEEE Transactions on Device and Materials Reliability vol. II, No. 3, Sep. 2011, pp. 417-425.

(Continued)

*Primary Examiner* — Scott Bauer
(74) *Attorney, Agent, or Firm* — Rosenberg, Klein & Lee

(57) ABSTRACT

An active guard ring structure is provided, which is applicable to improving latch-up immunity during the latch-up current test (I-test). The proposed active guard ring structure comprises an I/O circuit and an active protection circuit, wherein the I/O circuit receives a trigger current via an input pad and generates a corresponding bulk current since being triggered. The active protection circuit, connected between the I/O circuit and a core circuit, detects whether the trigger current is a positive or negative current pulse. When an intensity of the trigger current is larger than a threshold value, the active protection circuit controls the I/O circuit to provide a sink or compensation current so as to neutralize the bulk current and to reduce the net current flowing into or sourced from the core circuit, thereby increasing the latch-up resistance and immunity of the core circuit.

19 Claims, 7 Drawing Sheets

(56) References Cited

U.S. PATENT DOCUMENTS

| | | | |
|---|---|---|---|
| 8,292,302 | B2 | 10/2012 | Heldmann et al. |
| 8,395,241 | B2 | 3/2013 | Yang et al. |
| 8,474,828 | B2 | 7/2013 | Heldmann et al. |
| 8,492,873 | B1 | 7/2013 | Tan |
| 8,558,389 | B2 | 10/2013 | Na et al. |
| 8,587,023 | B2 | 11/2013 | Lee |
| 8,614,130 | B2 | 12/2013 | Jensen et al. |
| 2006/0231897 | A1* | 10/2006 | Duvvury ............ H01L 29/0619 257/356 |
| 2007/0109705 | A1* | 5/2007 | Gruber ................. H01L 23/62 361/93.1 |
| 2008/0151446 | A1* | 6/2008 | Ker .................... H01L 27/027 361/56 |
| 2012/0242373 | A1* | 9/2012 | Chen ................. H03K 3/356104 327/81 |
| 2013/0278284 | A1* | 10/2013 | Watanabe ............ H01L 23/576 326/8 |
| 2015/0077084 | A1* | 3/2015 | Chesnut ................. H02H 9/02 323/298 |

OTHER PUBLICATIONS

Farzan Farbiz; Elyse Rosenbaum; Modeling and Understanding of External Latchup in CMOS Technologies—Part II: Minority Carrier Collection Efficiency; IEEE Transactions on Device and Materials Reliability; vol. II, No. 3, Sep. 2011, pp. 426-432.

Tsun-Lai Hsu, Yu-Chia Chen, Hua-Chou Tseng, Victor Liang, and Jin Shyoung Jan; psub Guard Ring Design and Modeling for the Purpose of Substrate Noise Isolation in the SOC Era; IEEE Electron Device Letters, vol. 26, No. 9, Sep. 2005, pp. 693-695.

Ming-Dou Ker; Wen-Yu Lo; Methodology on Extracting Compact Layout Rules for Latchup Prevention in Deep-Submicron Bulk CMOS Technology; IEEE Transactions on Semiconductor Manufacturing, vol. 16, No. 2, May 2003, pp. 319-334.

* cited by examiner

ACTIVE GUARD RING STRUCTURE TO IMPROVE LATCH-UP IMMUNITY

This application claims priority for Taiwan patent application no. 103115815 filed at May 2, 2014, the content of which is incorporated by reference in its entirely.

BACKGROUND OF THE INVENTION

1. Field of the Invention

The present invention is related to an Electro-Static Discharge (ESD) circuit, and more particularly to an ESD circuit comprising active guard ring structure which is applicable to improving latch-up immunity under I-test.

2. Description of the Prior Art

Parastic PNPN paths are often existing in chips. It is needed to be aware of related short circuit failure identified as "Latch-up" for IC designers in both development and layout stages. Such failure brings out huge abnormal current from supply to ground if unexpected conduction through the parasitic PNPN structure is generated after voltage/current fluctuation is triggered at I/O pads. Therefore, to examine the latch-up immunity, methods as positive and negative I-test are defined in JEDEC standards (1997). In certain standards, a positive or negative trigger current valued 100 mA is injected in an I/O pin of the CMOS IC so as to examine if the latch-up occurs. Below is Table I provided, which shows the specification of the JEDEC standards, and has been widely used for decades by many companies to examine if their product ICs can pass the latch-up test.

TABLE I

| Trigger Source | Specification |
| --- | --- |
| Positive current at I/O pin | $I_{norm} + 100$ mA (or $1.5 * I_{norm}$) |
| Negative current at I/O pin | $-100$ mA (or $-0.5 * I_{norm}$) |
| Over-Voltage at VDD pin | $1.5 * V_{DD-Max}$ |

When it comes to 2011, the JEDEC standards (1997) has been updated to JESD78D (Nov. 2011), in which the trigger current of the highest latch-up level has been pursued to increasing from the previous +/−100 mA to +/−200 mA. Accordingly, for many companies, to promote and to examine the IC products to over 200 mA robustness against latch-up becomes a target specification. Since all the developments and layout stages for latch-up immunity were built under the previous specifications having trigger current equals +/−100 mA, when it is updated to +/−200 mA, methods as additional guard rings are proposed and implemented in the products so as to meet the latest standards. Nevertheless, by disposing additional guard rings in the products, it is merely designed for absorbing electrons or holes dissipating in the substrate/well of the IC and is known as such typical kind of passive strategy to increase the latch-up resistance of the chip.

Meanwhile, it is highly emphasized that methods as disposing additional guard rings are only effective upon those areas where the guard rings are located. In other words, for other areas where no guard rings are disposed, its latch-up immunity cannot be improved by doing so.

Moreover, when employing the traditional strategy to increase latch-up immunity, the tolerance toward the trigger current is always related to width of the guard ring and the distance to the internal latch-up paths. As such, when the I-test defined in JEDEC standards is updated from +/−100 mA to +/−200 mA, not only width and contacts of the guard ring, but also the distance from the I/O cells to the internal latch-up circuit must be increased. A plurality of design rules also have to be updated and modified to meet the new standards JESD78D. As a result, fabrication cost and production complexity will thus be affected and highly increased as well.

On account of all, it should be obvious that there is indeed an urgent need for the professionals in the field for a new active guard ring structure to be developed that can actively and aggressively improve latch-up immunity of IC design so as to solve the above-mentioned problems occurring in the prior design.

SUMMARY OF THE INVENTION

In order to overcome the above-mentioned disadvantages, one major objective in accordance with the present invention is provided for a novel and creative guard ring structure. By employing the novel guard ring structure of the present invention, it can be utilized so as to actively increase latch-up resistance of CMOS IC. Since the guard ring structure of the present invention is able to operate actively and spontaneously for improving latch-up immunity, it is called as an active guard ring structure.

Another objective in accordance with the present invention is provided for an active guard ring structure, which is distinct from the previous strategy to absorb electrons and/or holes in the substrate by disposing additional guard ring, thereby the present invention achieving magnificent effects of low fabrication cost and minimal fabrication area.

And yet another objective in accordance with the present invention is provided for an active guard ring structure. When a trigger current is injected to the CMOS IC of the present invention, the active guard ring structure of the present invention spontaneously detects the trigger current and accordingly provides a corresponding current so as to neutralize the trigger current and to reduce intensity of the fluctuations occurring at the I/O pad. Therefore, the net current flowing into or sourced from its core circuit can be effectively reduced, thereby improving the latch-up immunity.

For achieving the above mentioned objectives, the present invention provides an active guard ring structure connected between an input pad and a core circuit, which comprises an I/O circuit and an active protection circuit. The I/O circuit is connected to the input pad and receives a trigger current. Afterwards, the I/O circuit generates a bulk current when being triggered. The active protection circuit is connected between the I/O circuit and the core circuit, and detects the trigger current. When an intensity of the trigger current is higher than a threshold value, the active protection circuit controls the I/O circuit to generate a corresponding current so as to neutralize the bulk current. As a result, the net current flowing into or sourced from the core circuit can be effectively reduced to prevent the core circuit from encountering latch-up.

According to one embodiment of the present invention, when the trigger current is a positive current pulse, the corresponding current generated is a sink current. As for the trigger current being a negative current pulse, the corresponding current generated is a compensation current.

According to one embodiment of the present invention, the I/O circuit comprises a PMOS and a NMOS connected in series. The active protection circuit comprises a detection module and a control module, wherein the detection module is connected to the input pad, detects the trigger current and sends detection result to the control module. As such, the control module, according to the detection result controls on/off state of the PMOS or the NMOS of the I/O circuit so as to provide the corresponding sink or compensation current to neutralize the bulk current and to reduce the net current flowing into or source from the core circuit.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
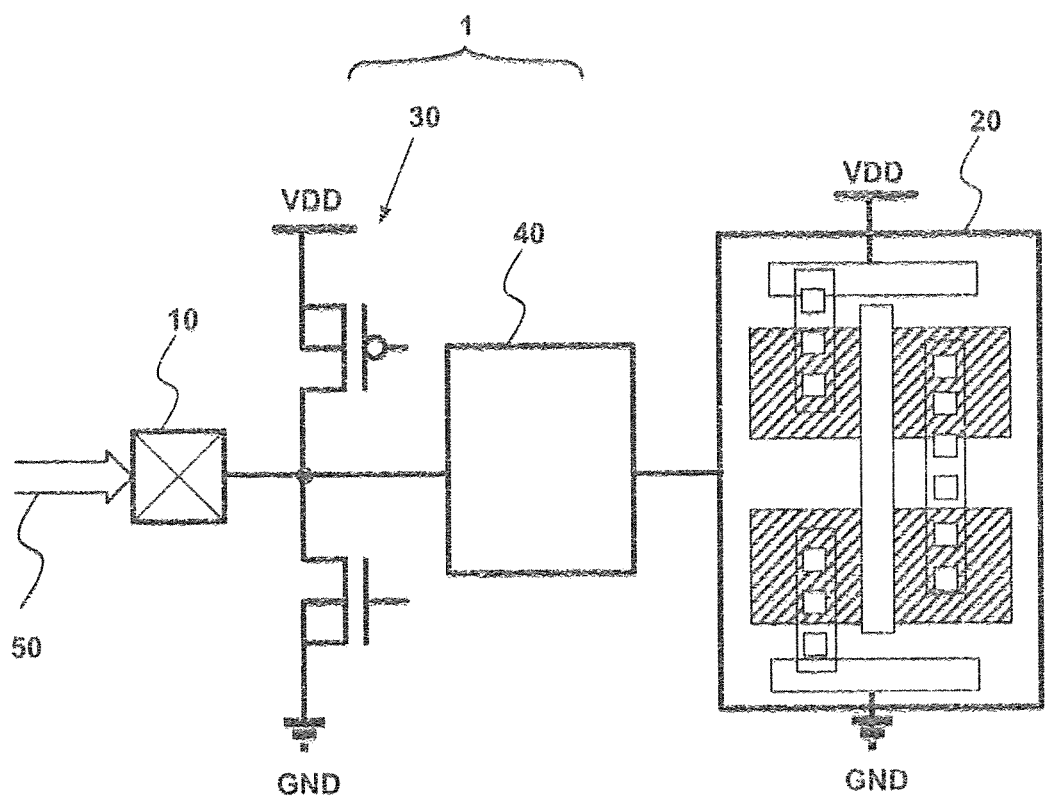
FIG. 1 shows a schematic concept of the active guard ring structure in accordance with one embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

The present invention discloses an active guard ring structure to improve latch-up immunity. Please refer to FIG. 1, which shows a schematic concept of the active guard ring structure in accordance with one embodiment of the present invention. As shown in FIG. 1, the active guard ring structure 1 is connected between an input pad 10 and a core circuit 20. When a trigger current 50 is injected into the input pad 10, the active guard ring structure 1 is able to detect the trigger current 50 and provides corresponding current adequately. By generating the corresponding current to neutralize a bulk current of the transistor, a net current flowing into or sourced from the core circuit can be effectively reduced and latch-up immunity of the CMOS IC is therefore improved.

To be more specific, the active guard ring structure 1 comprises an I/O circuit connected to the input pad 10 and receiving the trigger current 50; and an active protection circuit 40 connected between the I/O circuit 30 and the core circuit 20. According to the embodiment of the present invention, the active protection circuit 40 is able to detect the trigger current 50 and determine if the trigger current 50 is a positive or negative current pulse; and an intensity of the trigger current 50. Therefore, when the intensity of the trigger current 50 is higher than a threshold value, for example, 1 mA, then the active protection circuit 40 in turn controls the I/O circuit 30 to generate a corresponding current so as to neutralize the bulk current generated after the I/O circuit 30 is triggered.

Figure 2:
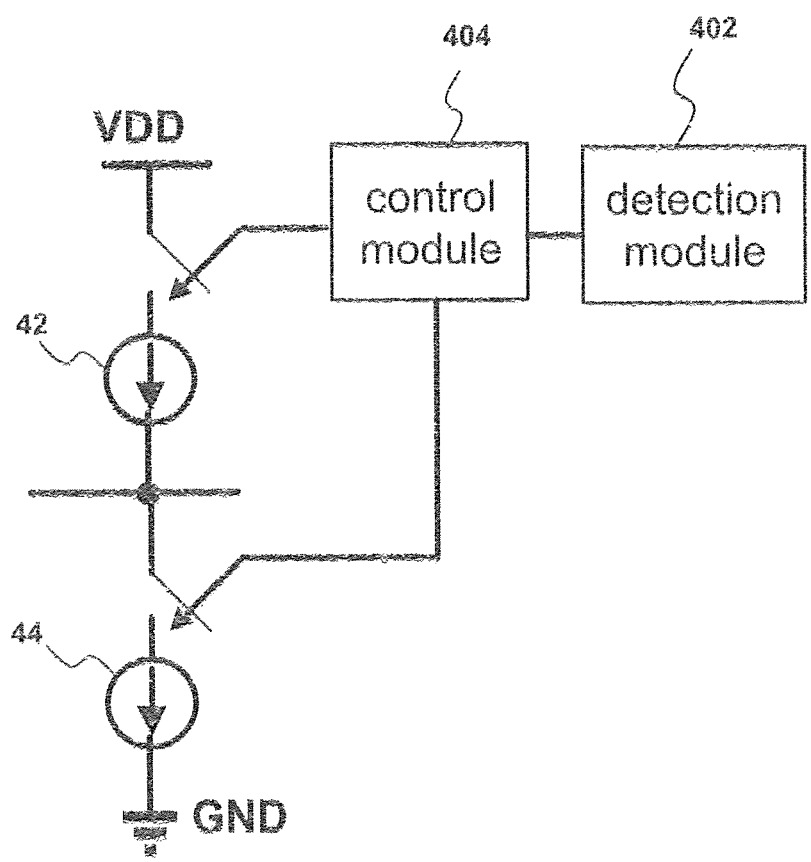
FIG. 2 show a block diagram of the active guard ring structure in accordance with one embodiment of the present invention
Figure 3:
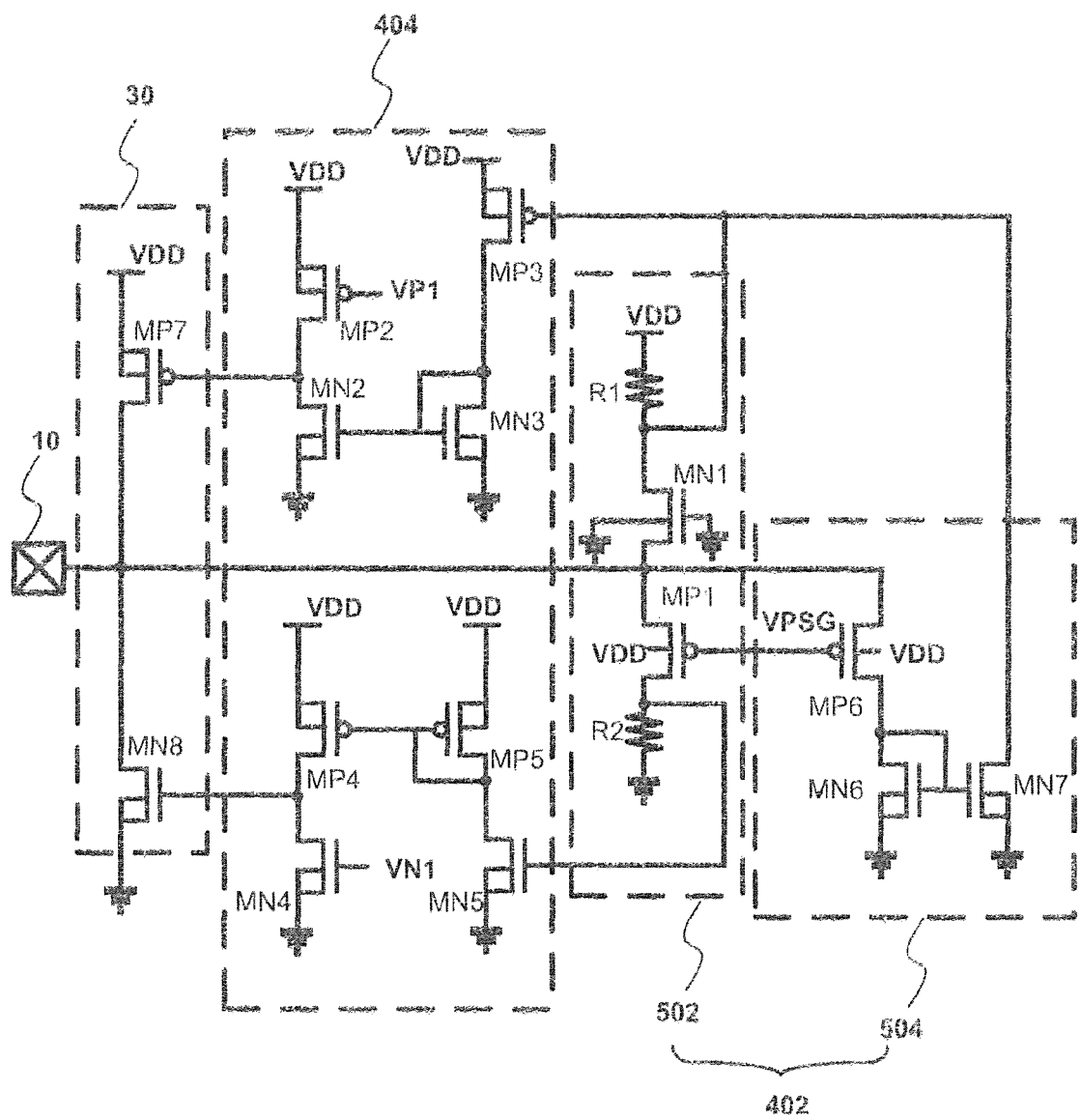
FIG. 3 shows a detailed circuit diagram of the active guard ring structure in accordance with one embodiment of the present invention

Please further refer to FIG. 2 and FIG. 3 which show a block diagram and a detailed circuit diagram of the active guard ring structure in accordance with one embodiment of the present invention, respectively. As seen, the active protection circuit 40 comprises a detection module 402 and a control module 404, wherein the detection module 402 is connected to the input pad 10 and detects the trigger current 50; the control module 404 is connected to the detection module 402 and the I/O circuit 30. Therefore, the detection module 402 can send the detection result to the control module 404, and the control module 404 controls the I/O circuit 30 to generate a corresponding current. According to the embodiment of the present invention, the corresponding current can be a compensation current 42 or a sink current 44 as shown in FIG. 2. By providing the compensation current 42 or sink current 44 to neutralize the bulk current of the transistor, a net current flowing into or sourced from the core circuit 20 can be effectively reduced, therefore preventing the core circuit 20 from encountering latch-up.

However, it should be noticed that the threshold value of the trigger current being detected is adjustable and designable. People skilled in the art are allowed to make various modifications without departing from the scope or spirit of the present invention and yet still fall within the scope of the invention and its equivalent. The proposed threshold value is explanatory abovementioned but not limited thereto.

As shown in FIG. 3, the detection module 402 comprises a sensing unit 502 and a current mirror 504, wherein the sensing unit 502 comprises a first NMOS MN1, a first PMOS MP1, a first resistor R1 and a second resistor R2. The control module 404 comprises a second NMOS MN2, a second PMOS MP2, a third NMOS MN3, a third PMOS MP3, a fourth NMOS MN4, a fourth PMOS MP4, a fifth NMOS MN5, and a fifth PMOS MP5, wherein MN2 and MP2 are connected in series; MN3 and MP3 are connected in series; MN4 and MP4 are connected in series; and MN5 and MP5 are connected in series to form complementary metal oxide semiconductor (CMOS) respectively. The current mirror 504 comprises a sixth PMOS MP6, a sixth NMOS MN6 and a seventh NMOS MN7. And, the I/O circuit comprises a set of seventh PMOS MP7 and an eighth NMOS MN8 connected in series.

For the sensing unit 502, a source of MN1 is connected to a source of MP1 and the input pad 10. One end of R1 is connected to a drain of MN1 while the other end of R1 is connected to VDD. A drain of MP1 is connected the ground through R2, and a gate of MN1 is also connected to the ground.

A gate of MP6 is connected to a gate of MP1, a source of MP6 is connected to a source of MP1 and the input pad 10, and a drain of MP6 is connected to a drain of MN6, a gate of MN6 and a gate of MN7. A source of MN6 is connected to the ground, and a gate of MN6 is connected to a gate of MN7. A source of MN7 is connected to the ground and a drain of MN7 is connected to a gate of MP3 and a drain of MN1.

For the I/O circuit 30, a drain of MP7 is connected to a drain of MN8 and the input pad 10. A source of MP7 and MN8 are connected to VDD and the ground, respectively. A gate of MP7 is connected to a drain of MN2 and a drain of MP2. A gate of MN8 is connected to a drain of MN4 and a drain of MP4.

For the control module 404, a gate of MN2 is connected to a gate of MN3 and a drain of MP3. A gate of MP4 is connected to a gate of MP5 and a drain of MN5. A gate of MN5 is connected to a drain of MP1.

As a result, when the sensing unit 502 composed of MN1, MP1, R1 and R2 detects if the trigger current 50 is a positive current pulse or a negative current pulse, and if its current intensity is higher than the threshold value (ex: 1 mA), the current mirror 504 informs the detection result to the control module 404 so that the control module 404 will then control the gate voltage of MP7 and MN8 to generate the corresponding sink or compensation current.

Figure 4:
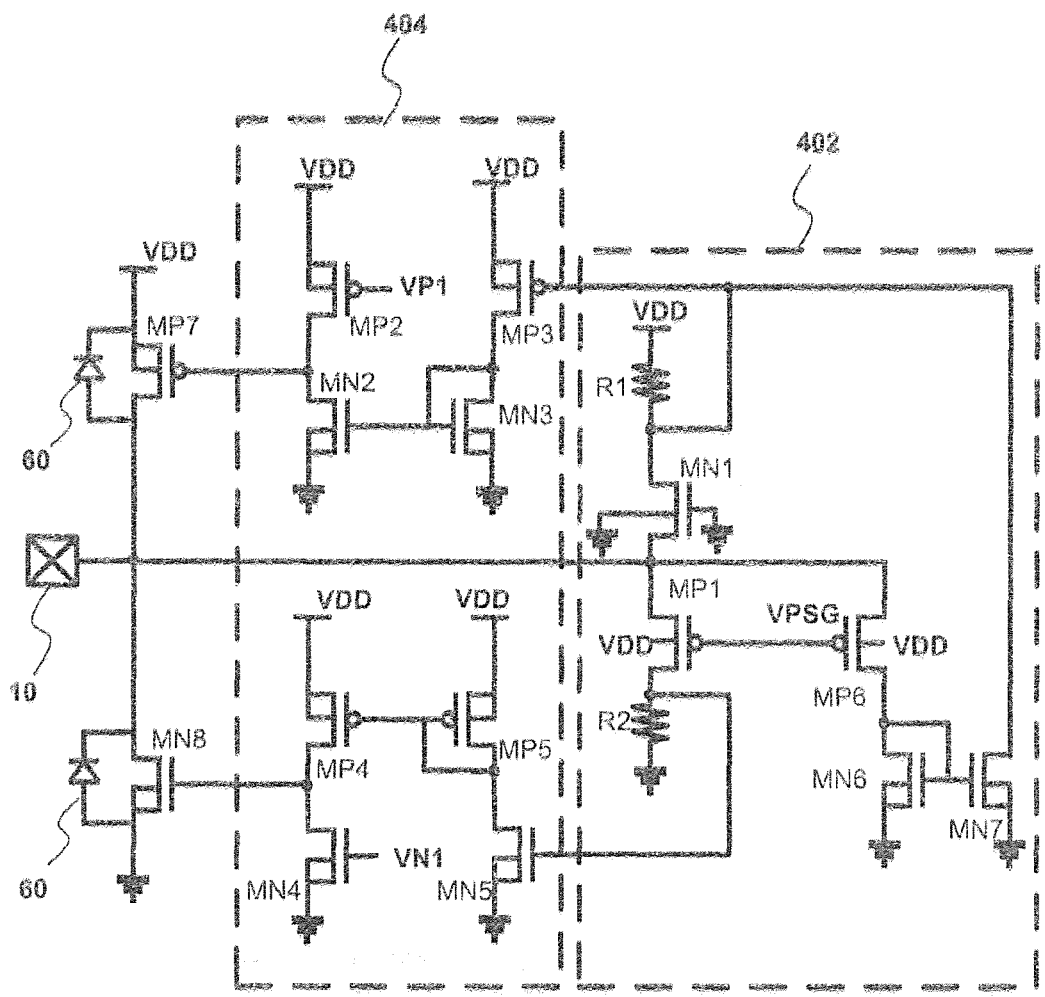
FIG. 4 shows a schematic drawing of the active guard ring structure in accordance with a preferred embodiment of the present invention.

FIG. 4 shows a schematic drawing of the active guard ring structure in accordance with a preferred embodiment of the present invention. What differs from the embodiment shown in FIG. 1 is that at least one single guard protection 60 is further disposed in parallel to MP7 and MN8 for absorbing electrons and/or holes dissipating in the substrate/well of the transistor. As such, the net current flowing into the core circuit can thus be further reduced, and the latch-up resistance can further be improved without paying the cost for too much extra area to the existing large dimension ESD NMOS and PMOS transistors.

As illustrated in Table I provided earlier, the current test of CMOS IC latch-up defined comprises both positive current and negative current as trigger current perturbation at the input pad. Therefore, to prove the present invention can be successfully utilized to improve latch-up immunity, positive current pulse and negative current pulse are individually injected as trigger source to examine if latch-up will be avoided. A full description is discussed below.

Figure 5:
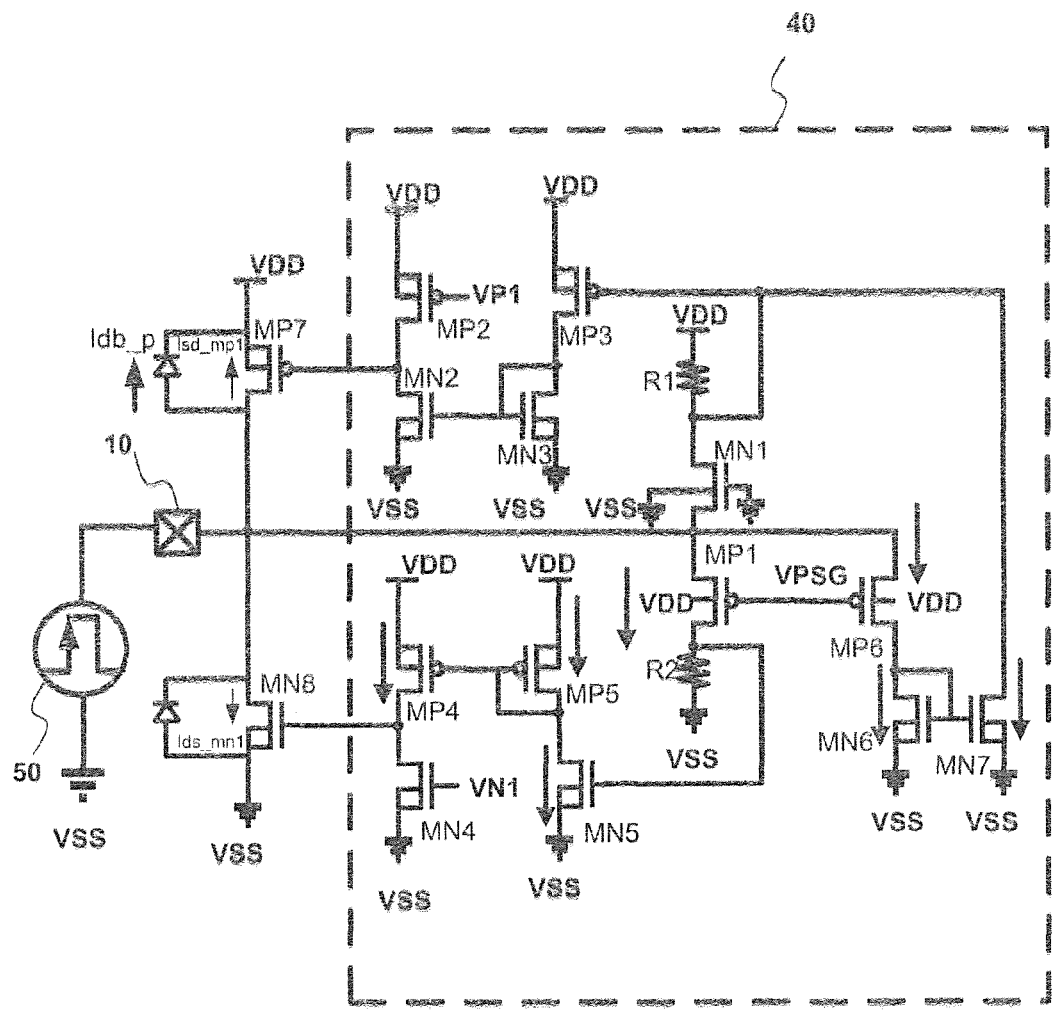
FIG. 5 shows operations of the proposed active guard ring structure under positive I-test in accordance with one embodiment of the present invention.
Figure 6:
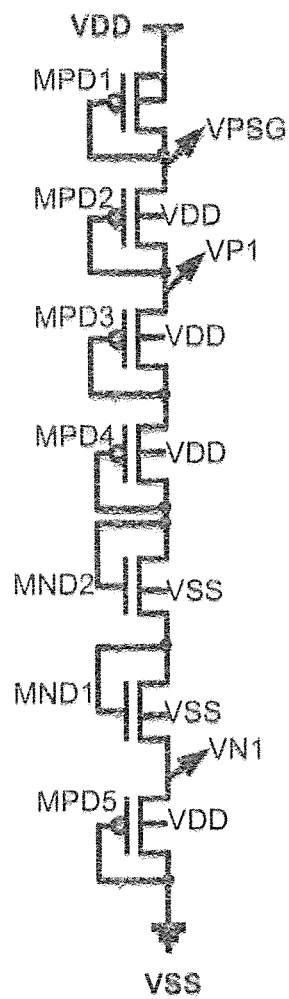
FIG. 6 shows a schematic drawing of using a plurality of diode string connected in series to generate required voltages of the present invention.

Please refer to FIG. 5 and FIG. 6 first. FIG. 5 shows operations of the proposed active guard ring structure under positive I-test in accordance with one embodiment of the present invention. FIG. 6 shows a schematic drawing of using a plurality of diode string connected in series to generate required voltages of the present invention. The diode string includes MPD1, MPD2, MPD3, MPD4, MPD5, MND1 and MND2 connected in series to generate the required voltage VPSG, VP1, and VN1, wherein VPSG is used as gate terminal for driving MP1 and MP6, VP1 is used to drive MP2, and VN1 is used to drive MN4.

As shown in FIG. 5, when the trigger current 50 a positive current pulse and its current intensity is greater than 1 mA, the voltage of the input pad 10 is raised and reaches to the value over VDD. In such condition, there is current flow from the drain terminal to the bulk terminal of MP7, generating a bulk current Idb_p. However, since the VPSG is slightly smaller than VDD, the source-to-gate voltages of MP1 and MP6 are large enough to generate corresponding channel currents when pad voltage is enough larger than VDD. The gate voltages of transistors MN5 and MP3 are thus pulled high and low, respectively. The current mirror MN3 and MN2 then mirrors the current of MP3 to compare with the current sourced from MP2. Once the mirrored current is larger, the gate voltage of MP7 is pulled low to turn on transistor MP7. Thus, the related source-to-drain current Isd_mp1 is generated.

Similarly, with the assistance of MP4 and MP5, there is also a mirrored current from MN5 to be compared with the drain current of MP4. While the mirrored current is larger, the gate voltage of MN8 is pulled high. Therefore, the transistor MN8 is turned on and produces the related drain-to-source current Ids_mn1. Due to the generation of Isd_mp1 and Ids_mn1, the amount of the drain-to-bulk current of Idb_p and the substrate current flew in the core circuit are reduced and thus promote the latch-up resistance of the testkey under test in the positive I-test.

Figure 7:
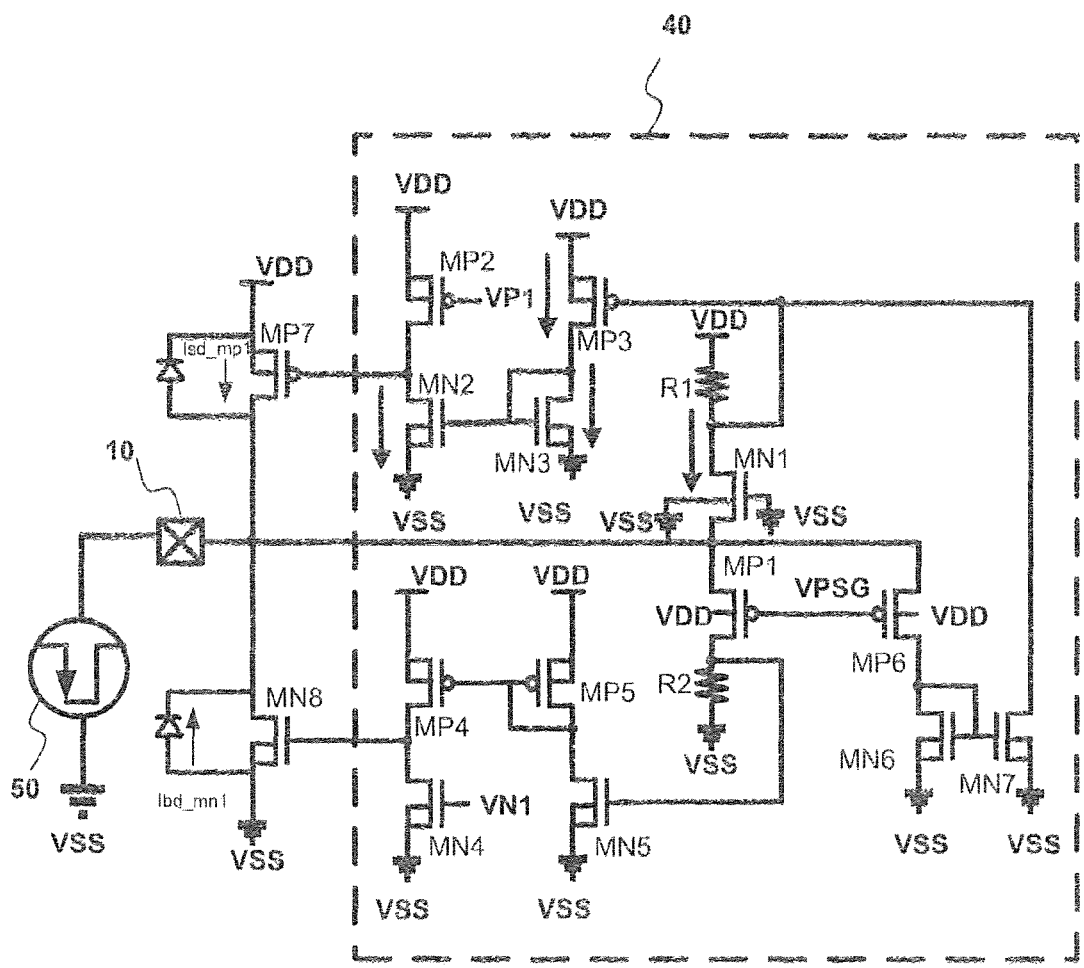
FIG. 7 shows operations of the proposed active guard ring structure under negative I-test in accordance with one embodiment of the present invention.

On the other hand, please refer to FIG. 7, which shows operations of the proposed active guard ring structure under negative I-test in accordance with one embodiment of the present invention. As shown in FIG. 7, when the trigger current 50 is a negative current pulse and its current intensity is greater than 1 mA, the voltage of the input pad 10 is pulled to lower than the value VSS. In such condition, certain current at drain terminal of MN1 is induced. The related voltage difference across the resistor R1 is thus pulled low the gate voltage of MP3 and the source-to-gate voltage of MP3 is larger than its own threshold voltage. Corresponding channel currents in transistors MP3 and MN3 are formed. The transistor MN3 then mirrors a current to transistor MN2. If the current flew in MN2 is larger than the current flows from MP2, the gate voltage of MP7 is pulled low and turns on the transistor MP7. Certain amount of current is generated and depicted as Isd_mp1. Thus by generating Isd_mp1, the bulk-to-drain current Ibd_mn1 of MN8 and the substrate current sourced from the core circuit are compensated and also reduced toward the same trigger current at the input pad. As such, the latch-up resistance of the testkey under test in the negative I-test is promoted as well. Besides, since the latch-up immunity under negative I-test is intrinsically higher, simpler structure to only turn on transistor MP7 will be quite enough, though.

Therefore, to summarize, when the trigger current at the input pad is a positive current pulse, the present invention is aimed to control the transistor MN8 to turn on so as to generate Ids_mn1 as the sink current for neutralization. On the contrary, when the trigger current at the input pad is a negative current pulse, the transistor MP7 is controlled to be turned on so as to generate Isd_mp1 as the compensation current for neutralization. As a result, the net current flowing into or sourced from an internal circuit of CMOS IC can be effectively reduced, thereby enhancing latch-up immunity.

Next, the present invention is verified with implementing test cells to examine the experimental results, which are shown as Table II. As the organized results for the testkey with the conventional design (with single guard protection only) and the proposed invention (with active guard ring structure) are listed in the Table II, it is apparent that the tolerance in positive I-test for the proposed design is ~260 mA which is more than 50 times better than the 5 mA performance of the conventional design. Besides, the immunity in the negative I-test of the proposed invention is also increased to ~430 mA compared to −190 mA for the conventional design. And both the positive I-test and the negative I-test are able to pass the new standards +/−200 mA defined in JESD78D. From the experimental results, the proposed invention is verified to reach the highest level (>200 mA) defined in JESD78D standards and is thus helpful for qualified IC production in latch-up prevention concern.

TABLE II

| | Conventional design | | Proposed invention | |
|---|---|---|---|---|
| Latch-up I-test | Pass | Fail | Pass | Fail |
| Positive I-test | 5 mA | 10 mA | 260 mA | 270 mA |
| Negative I-test | −190 mA | −200 mA | −430 mA | −440 mA |

Therefore, to sum up, the present invention indeed provides a novel and inventive active guard ring structure which has never been seen or proposed ever before. When a positive or negative trigger current is applied as perturbation at the input pad of the proposed design, the active guard ring structure of the present invention spontaneously detects the strength and intensity of the applied current, and accordingly produces a corresponding current to neutralize the perturbation at pad. Therefore, the net current flowing into or sourced from its internal circuit can be successfully reduced, thereby enhancing latch-up immunity.

Furthermore, as compared to the prior designed circuit which can only add additional guard protection in a passive way to slightly enhance latch-up immunity, the present invention is extraordinarily beneficial to dramatically increase latch-up resistance of the chip. Moreover, the present invention is not only advantageous of low fabrication cost, complexity and area consuming, but also helpful to manufacturing qualified CMOS IC under new latch-up test standards. Thus, it is believed that the present invention is instinct, effective and highly competitive for IC technology, industries and researches developed in the future.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An active guard ring structure to improve latch-up immunity, which is connected between an input pad and a core circuit, comprising:
an I/O circuit, connected to said input pad and receiving a trigger current, said I/O circuit generating a bulk current after being triggered by said trigger current; and an active protection circuit, connected between said I/O circuit and said core circuit, wherein said active protection circuit detects said trigger current and when intensity of said trigger current is higher than a threshold value, said active protection circuit controls said I/O circuit to provide a corresponding current so as to neutralize said bulk current and to prevent said core circuit from encountering latch-up.

2. The active guard ring structure to improve latch-up immunity of claim 1, wherein when said trigger current is a positive current pulse, said corresponding current is a sink current so as to reduce a net current flowing into said core circuit, or when said trigger current is a negative current pulse, said corresponding current is a compensation current so as to reduce a net current sourced from said core circuit.

3. The active guard ring structure to improve latch-up immunity of claim 2, wherein said active protection circuit further comprises a detection module and a control module, said detection module is connected to said input pad to detect said trigger current and send a detection result to said control module, said control module is connected to said detection module and said I/O circuit to control said I/O circuit for generating said corresponding current based on said detection result.

4. The active guard ring structure to improve latch-up immunity of claim 3, wherein said detection module further comprises:
a sensing unit, for sensing if said trigger current is said positive current pulse or said negative current pulse, said sensing unit comprising: a first NMOS, a first PMOS, a first resistor and a second resistor, wherein a source of said first NMOS is connected to a source of said first PMOS and said input pad, one end of said first resistor is connected to a drain of said first NMOS while the other end is connected to a high voltage level, a drain of said first PMOS is connected a ground through said second resistor, and a gate of said first NMOS is connected to said ground; and
a current mirror, connected between said first PMOS and said control module for informing said detection result of said detection module to said control module.

5. The active guard ring structure to improve latch-up immunity of claim 4, said control module further comprising: a second NMOS, a second PMOS, a third NMOS, a third PMOS, a fourth NMOS, a fourth PMOS, a fifth NMOS and a fifth PMOS, wherein said second NMOS and said second PMOS are connected in series; said third NMOS and said third PMOS are connected in series; said fourth NMOS and said fourth PMOS are connected in series; and said fifth NMOS and said fifth PMOS are connected in series to form complementary metal oxide semiconductor (CMOS) respectively, a gate of said second NMOS is connected to a gate of said third NMOS and a drain of said third PMOS, a gate of said fourth PMOS is connected to a gate of said fifth PMOS and a drain of said fifth NMOS, a drain of said second NMOS is connected to a drain of said second PMOS and said I/O circuit, a drain of said fourth NMOS is connected to a drain of said fourth PMOS and said I/O circuit, a gate of said third PMOS is connected to said current mirror and a drain of said first NMOS, and a gate of said fifth NMOS is connected to a drain of said first PMOS of said sensing unit.

6. The active guard ring structure to improve latch-up immunity of claim 5, said current mirror further comprising: a sixth PMOS, a sixth NMOS and a seventh NMOS, wherein a gate of said sixth PMOS is connected to a gate of said first PMOS, a source of said sixth PMOS is connected to a source of said first PMOS and said input pad, a drain of said sixth PMOS is connected to a drain of said sixth NMOS, a source of said sixth NMOS is connected to said ground, a gate of said sixth NMOS is connected to a gate of said seventh NMOS, a source of said seventh NMOS is connected to said ground, and a drain of said seventh NMOS is connected to a gate of said third PMOS and a drain of said first NMOS.

7. The active guard ring structure to improve latch-up immunity of claim 5, said I/O circuit further comprising a set of seventh PMOS and an eighth NMOS connected in series, wherein a drain of said seventh PMOS is connected to a drain of said eighth NMOS and said input pad, a source of said seventh PMOS and said eighth NMOS are connected to said high voltage level and said ground, respectively, a gate of said seventh PMOS is connected to a drain of said second NMOS and a drain of said second PMOS, and a gate of said eighth NMOS is connected to a drain of said fourth NMOS and a drain of said fourth PMOS.

8. The active guard ring structure to improve latch-up immunity of claim 7, wherein when said trigger current is said positive current pulse, said eighth NMOS is turned on to generate said sink current.

9. The active guard ring structure to improve latch-up immunity of claim 7, wherein when said trigger current is said negative current pulse, said seventh PMOS is turned on to generate said compensation current.

10. The active guard ring structure to improve latch-up immunity of claim 7, further comprising at least one single guard protection disposed in parallel to said seventh PMOS or said eighth NMOS for reducing said net current flowing into or sourced from core circuit.

11. An active protection circuit, connected to a core circuit for preventing said core circuit from encountering latch-up, comprising:
a detection module, connected to an input pad for detecting a triggered current injected into said input pad; a current mirror; and
a control module, connected to said detection module and receiving a detection result of said detection module, wherein when intensity of said trigger current is higher than a threshold value, a corresponding current is generated so as to prevent said core circuit from encountering latch-up; said detection module further including:
a sensing unit, for sensing if said trigger current is a positive current pulse or a negative current pulse and if said intensity of said trigger current is higher than said threshold value; wherein said current mirror is connected between said control module and said sensing unit.

12. The active protection circuit of claim 11, wherein said trigger current is said positive current pulse, and said corresponding current is a sink current so as to reduce a net current flowing into said core circuit.

13. The active protection circuit of claim 11, wherein said trigger current is said negative current pulse, and said corresponding current is a compensation current so as to reduce a net current sourced from said core circuit.

14. The active protection circuit of claim 12, wherein said sensing unit comprises: a first NMOS, a first PMOS, a first resistor and a second resistor, wherein a source of said first NMOS is connected to a source of said first PMOS and said input pad, one end of said first resistor is connected to a drain of said first NMOS while the other end is connected to a high voltage level, a drain of said first PMOS is connected a ground through said second resistor, and a gate of said first NMOS is connected to said ground; and said current mirror is further connected between a gate of said first PMOS and said control module for informing said detection result of said detection module to said control module.

15. The active protection circuit of claim 14, said control module further comprising: a second NMOS, a second PMOS, a third NMOS, a third PMOS, a fourth NMOS, a fourth PMOS, a fifth NMOS and a fifth PMOS, wherein said second NMOS and said second PMOS are connected in series; said third NMOS and said third PMOS are connected in series; said fourth NMOS and said fourth PMOS are connected in series; and said fifth NMOS and said fifth PMOS are connected in series to form complementary metal oxide semiconductor (CMOS) respectively, a gate of said second NMOS is connected to a gate of said third NMOS and a drain of said third PMOS, a gate of said fourth PMOS is connected to a gate of said fifth PMOS and a drain of said fifth NMOS, a drain of said second NMOS is connected to a drain of said second PMOS and an I/O circuit, a drain of said fourth NMOS is connected to a drain of said fourth PMOS and said I/O circuit, a gate of said third PMOS is connected to said current mirror and a drain of said first NMOS, and a gate of said fifth NMOS is connected to a drain of said first PMOS of said sensing unit.

16. The active protection circuit of claim 15, said current mirror further comprising: a sixth PMOS, a sixth NMOS and a seventh NMOS, wherein a gate of said sixth PMOS is connected to a gate of said first PMOS, a source of said sixth PMOS is connected to a source of said first PMOS and said input pad, a drain of said sixth PMOS is connected to a drain of said sixth NMOS, a source of said sixth NMOS is connected to said ground, a gate of said sixth NMOS is connected to a gate of said seventh NMOS, a source of said seventh NMOS is connected to said ground, and a drain of said seventh NMOS is connected to a gate of said third PMOS and a drain of said first NMOS.

17. The active protection circuit of claim 13, wherein said sensing unit comprises: a first NMOS, a first PMOS, a first resistor and a second resistor, wherein a source of said first NMOS is connected to a source of said first PMOS and said input pad, one end of said first resistor is connected to a drain of said first NMOS while the other end is connected to a high voltage level, a drain of said first PMOS is connected a ground through said second resistor, and a gate of said first NMOS is connected to said ground; and said current mirror is further connected between a gate of said first PMOS and said control module for informing said detection result of said detection module to said control module.

18. The active protection circuit of claim 17, said control module further comprising: a second NMOS, a second PMOS, a third NMOS, a third PMOS, a fourth NMOS, a fourth PMOS, a fifth NMOS and a fifth PMOS, wherein said second NMOS and said second PMOS are connected in series; said third NMOS and said third PMOS are connected in series; said fourth NMOS and said fourth PMOS are connected in series; and said fifth NMOS and said fifth PMOS are connected in series to form complementary metal oxide semiconductor (CMOS) respectively, a gate of said second NMOS is connected to a gate of said third NMOS and a drain of said third PMOS, a gate of said fourth PMOS is connected to a gate of said fifth PMOS and a drain of said fifth NMOS, a drain of said second NMOS is connected to a drain of said second PMOS and an I/O circuit, a drain of said fourth NMOS is connected to a drain of said fourth PMOS and said I/O circuit, a gate of said third PMOS is connected to said current mirror and a drain of said first NMOS, and a gate of said fifth NMOS is connected to a drain of said first PMOS of said sensing unit.

19. The active protection circuit of claim 18, said current mirror further comprising: a sixth PMOS, a sixth NMOS and a seventh NMOS, wherein a gate of said sixth PMOS is connected to a gate of said first PMOS, a source of said sixth PMOS is connected to a source of said first PMOS and said input pad, a drain of said sixth PMOS is connected to a drain of said sixth NMOS, a source of said sixth NMOS is connected to said ground, a gate of said sixth NMOS is connected to a gate of said seventh NMOS, a source of said seventh NMOS is connected to said ground, and a drain of said seventh NMOS is connected to a gate of said third PMOS and a drain of said first NMOS.

* * * * *